(12) United States Patent
Kim (10) Patent No.: US 11,866,336 B2
(45) Date of Patent: Jan. 9, 2024

(54) METHOD FOR PRODUCING REDUCED GRAPHENE OXIDE

(71) Applicant: UNIST(ULSAN NATIONAL INSTITUTE OF SCIENCE AND TECHNOLOGY), Ulsan (KR)

(72) Inventor: Gun Ho Kim, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 521 days.

(21) Appl. No.: 17/271,199

(22) PCT Filed: Aug. 26, 2019

(86) PCT No.: PCT/KR2019/010825
§ 371 (c)(1),
(2) Date: Feb. 24, 2021

(87) PCT Pub. No.: WO2020/045911
PCT Pub. Date: Mar. 5, 2020

(65) Prior Publication Data
US 2022/0119263 A1    Apr. 21, 2022

(30) Foreign Application Priority Data
Aug. 27, 2018   (KR) .................. 10-2018-0100576

(51) Int. Cl.
*C01B 32/198* (2017.01)
*C23C 16/40* (2006.01)
(Continued)

(52) U.S. Cl.
CPC ............ *C01B 32/198* (2017.08); *C23C 16/40* (2013.01); *C23C 16/45557* (2013.01); *C23C 16/46* (2013.01)

(58) Field of Classification Search
CPC ... C01B 32/198; C01B 32/194; C01B 32/182; C01B 32/184; C01B 32/186;
(Continued)

(56) References Cited

U.S. PATENT DOCUMENTS

| 2010/0021708 | A1  | 1/2010  | Kong et al. |                      |
|--------------|-----|---------|-------------|----------------------|
| 2012/0277360 | A1* | 11/2012 | Scheffer    | C08K 3/04<br>524/237 |
| 2016/0185604 | A1* | 6/2016  | Shyam       | B05D 7/584<br>427/388.1 |

FOREIGN PATENT DOCUMENTS

KR    101393096 B1    5/2014
KR    20150140623 A   12/2015
(Continued)

OTHER PUBLICATIONS

International Search Report and Written Opinion for PCT/KR2019/010825, dated Dec. 2, 2019 (w/English International Search Report).
(Continued)

*Primary Examiner* — Daniel C. McCracken
(74) *Attorney, Agent, or Firm* — Klarquist Sparkman, LLP (57) ABSTRACT

An embodiment of the present disclosure provides a method of producing a reduced graphene oxide, the method including arranging a carbon material; arranging a substrate adjacent to the arranged carbon material; heating the arranged carbon material to a temperature of about 600° C. or higher, and depositing the heated carbon material on the substrate to form a reduced graphene oxide thin film, wherein the arranged carbon material is solid seedlac.

15 Claims, 5 Drawing Sheets

(51) Int. Cl.
*C23C 16/455* (2006.01)
*C23C 16/46* (2006.01)

(58) Field of Classification Search
CPC ..... C01B 32/188; C01B 32/19; C01B 32/192; C01B 32/196; C01B 2204/00; C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23; C23C 16/40; C23C 16/45557; C23C 16/46; C23C 16/26; C23C 16/4485
See application file for complete search history.

(56) References Cited

FOREIGN PATENT DOCUMENTS

KR    20180039156 A    4/2018
WO    WO 2018/104802   *  6/2018  ............. C01B 32/16

OTHER PUBLICATIONS

Sun, Zhengzong et al., "Growth of graphene from soiid carbon sources," *Nature*, 468:549-552 (Nov. 25, 2010).

* cited by examiner

METHOD FOR PRODUCING REDUCED GRAPHENE OXIDE

CROSS REFERENCE TO RELATED APPLICATIONS

This is the U.S. National Stage of International Application No. PCT/KR2019/010825, filed Aug. 26, 2019, which in turn claims the benefit of Korean Patent Application No. 10-2018-0100576, filed Aug. 27, 2018, which applications are incorporated herein in their entirety.

TECHNICAL FIELD

One or more embodiments of the present disclosure relate to a method of producing a reduced graphene oxide (RGO).

BACKGROUND ART

Graphene is an allotrope of carbon and may have a two-dimensional (2D) plane structure composed of carbon atoms that are arranged in a hexagonal shape. The hexagonal shape is called a honeycomb structure or a honeycomb lattice. A thickness of the graphene is as thin as about 0.2 nm, and thus the graphene has high transparency and high physical and chemical stability.

Graphene at room temperature may conduct more electric current than copper and deliver electrons faster than silicon, and has high thermal conductivity, high physical strength, and excellent elasticity. Due to these excellent properties, graphene has been applied in various fields such as in transistors, transparent electrodes, electronic paper, displays, and secondary batteries.

Methods of preparing graphene may include mechanical exfoliation. Mechanical exfoliation includes attaching an adhesive material such as scotch tape to the graphite and then peeling off a layer of the graphene with the tape. Since the adhesion between a surface of the graphene and the adhesive member is stronger than the bonding force between graphene layers, graphene falls off while adhered to the scotch tape.

When mechanical exfoliation is used to prepare graphene peeled graphene may not be uniform and may not have a large area, and thus mechanical exfoliation is limited in terms of mass production of graphene.

Another method of preparing graphene may be chemical exfoliation. Chemical exfoliation is a method that uses oxidation/reduction characteristics of graphite. Chemical exfoliation is a method of oxidizing graphite with a strong acid to prepare a graphite oxide and then peeling the graphite oxide by stirring or using an ultrasonic grinder for a long time.

However, when chemical exfoliation is used, a $sp^2$ hybridized carbon structure of graphene undergoes significant destruction in the process of oxidation and ultrasonic waves, and thus chemical exfoliation is also limited in terms of the resulting poor quality of the peeled graphene.

When graphene oxide prepared using chemical exfoliation is chemically reduced, functional groups including oxygen bonded to the graphene oxide are removed, and a reduced graphene oxide is produced.

On the other hand, a method of preparing a reduced graphene oxide of the related art is limited in terms of using a toxic reducing agent such as hydrazine to reduce a graphene oxide, using a process that requires complex control, using a process that requires a high cost, or resulting poor quality of a reduced graphene oxide produced using the preparation method.

DESCRIPTION OF EMBODIMENTS

Technical Problem

According to embodiments of the present disclosure, provided is a method of producing a reduced graphene oxide, wherein the method is to resolve these problems described above and to produce a reduced graphene oxide of good quality without using a toxic chemical material and a complex process.

Solution to Problem

According to an embodiment of the present disclosure, a method of producing a reduced graphene oxide includes arranging a carbon material; arranging a substrate adjacent to the arranged carbon material; heating the carbon material to a temperature of about 600° C. or higher; and depositing the heated carbon material on the substrate to form a reduced graphene oxide thin film, wherein the arranged carbon material may be solid seedlac.

Advantageous Effects of Disclosure

A method of producing a reduced graphene oxide according to an embodiment of the present disclosure does not use a toxic chemical material and uses a simple process. Also, a reduced graphene oxide according to an embodiment of the present disclosure has good quality and, more particularly, has an excellent $I_D/I_G$ ratio and a sheet resistance value.

BEST MODE

According to an embodiment of the present disclosure, a method of producing a reduced graphene oxide includes arranging a carbon material; arranging a substrate adjacent to the arranged carbon material; heating the arranged carbon material to a temperature of about 600° C. or higher; and depositing the heated carbon material on the substrate to form a reduced graphene oxide thin film, wherein the arranged carbon material may be solid seedlac.

According to an embodiment of the present disclosure, the arranged carbon material may be heated to about 800° C.

According to an embodiment of the present disclosure, the substrate may include any one selected from a metal, an alloy, a metal oxide, a semiconductor material, and an insulating material.

According to an embodiment of the present disclosure, the substrate may include a wafer.

According to an embodiment of the present disclosure, the substrate may include an oxidized wafer having an oxide layer formed on a surface thereof.

According to an embodiment of the present disclosure, a diameter of the wafer may be in a range of about 2.0 inches or more to about 8.0 inches or less.

According to an embodiment of the present disclosure, a diameter of the wafer may be about 2.5 inches.

According to an embodiment of the present disclosure, the solid seedlac may be in a form of a powder or a thin film.

According to an embodiment of the present disclosure, a weight of the solid seedlac may be in a range of equal to or greater than about 1 μg and less than or equal to about 1000 kg.

According to an embodiment of the present disclosure, a weight of the solid seedlac may be about 1.5 g.

According to an embodiment of the present disclosure, the carbon material and the substrate may be arranged in a heating chamber of which an internal temperature is controllable, and the substrate may be arranged in a space within about 1 m around the carbon material.

According to an embodiment of the present disclosure, the heating chamber may be filled with a gas (nitrogen, argon; or helium), and an internal pressure of the heating chamber is atmospheric pressure or lower.

According to an embodiment of the present disclosure, the gas (nitrogen, argon, or helium) may flow from the carbon material to the substrate.

According to an embodiment of the present disclosure, the internal pressure of the heating chamber may be about $1 \times 10^{-1}$ torr or lower.

According to an embodiment of the present disclosure, the internal pressure of the heating chamber may be about $1 \times 10^{-2}$ torr or lower.

According to an embodiment of the present disclosure, an internal space of the heating chamber may be cylindrical.

MODE OF DISCLOSURE

Hereinafter, only exemplary embodiments will be described in detail with reference to the accompanying drawings. The following examples are only for the purpose of embodying the spirit of the present disclosure, and of course, it does not limit or limit the scope of rights of the disclosure. From the detailed description and examples, what can be easily inferred by those skilled in the art is interpreted as belonging to the scope of rights.

As used herein, the terms such as "formed of", "including", or "comprising" should not be construed as necessarily including all of the various components or steps described in the specification and should be construed as omitting some of the components or steps or further including additional components or steps among the various components or steps.

Although general current terms have been used to describe the inventive concept based on the functions in the present disclosure, the terms may vary according to the intention of one of ordinary skill in the art, case precedents, and the appearance of new technology. Also, in specific situations, terms selected by the applicant may be used, and in these situations, the meaning of these terms will be disclosed in corresponding descriptions of the specification. Accordingly, the terms used in the specification to describe the present disclosure should not be defined by their simple names but by their meanings in the context of the present disclosure.

Figure 1:
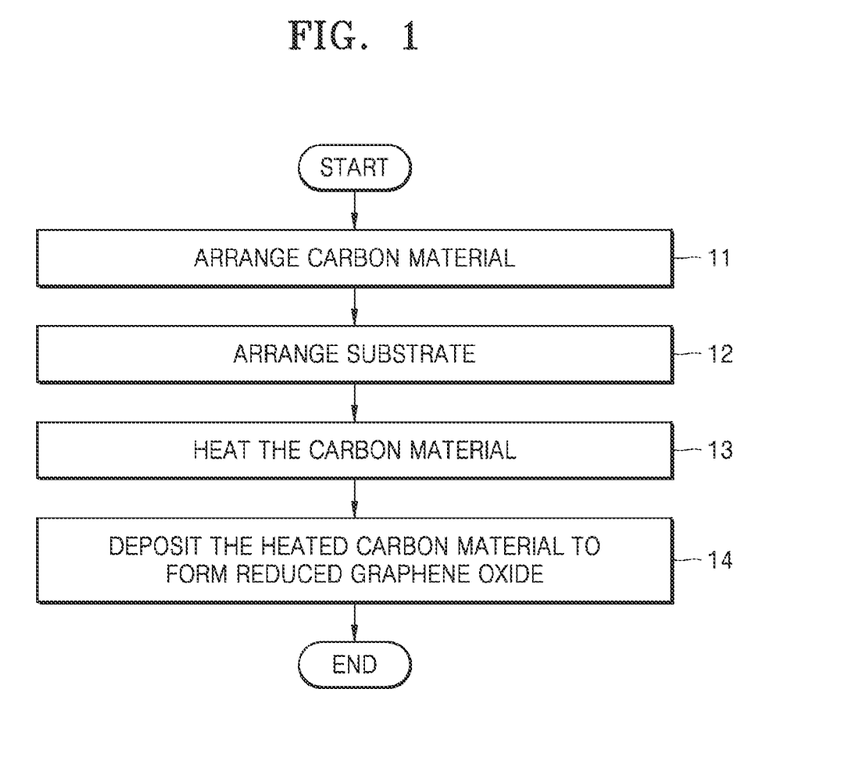
FIG. 1 is a flowchart that illustrates a method of producing a reduced graphene oxide, according to an embodiment.
Figure 2:
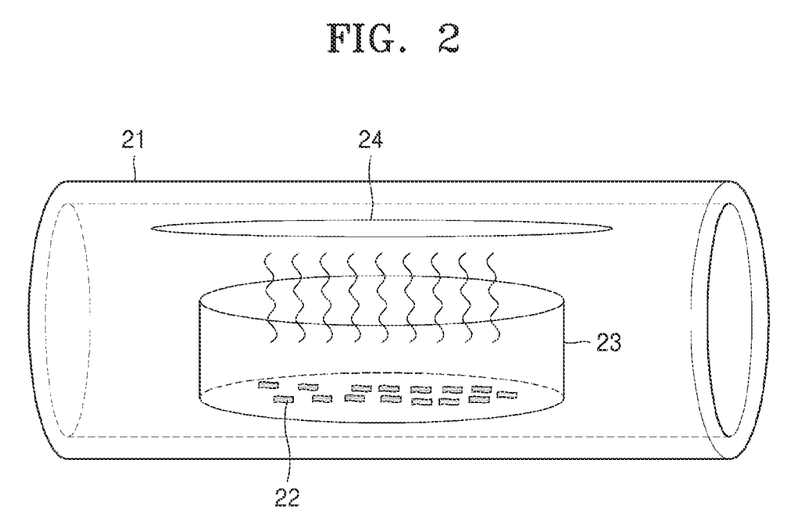
FIG. 2 illustrates a device that performs the production method, according to an embodiment.

FIG. 1 is a flowchart that illustrates a method of producing a reduced graphene oxide according to an embodiment. FIG. 2 illustrates a device that performs the method according to an embodiment.

Referring to FIGS. 1 and 2, in step 11, a carbon material 22 is arranged in a heating chamber 21.

The heating chamber 21 may be a device of which environmental factors such as internal temperature and pressure are controllable as a process proceeds and may be a tube furnace having an internal space, which is cylindrical. The internal space of the heating chamber 21 may be in various shapes in addition to a cylinder.

Figure 3:
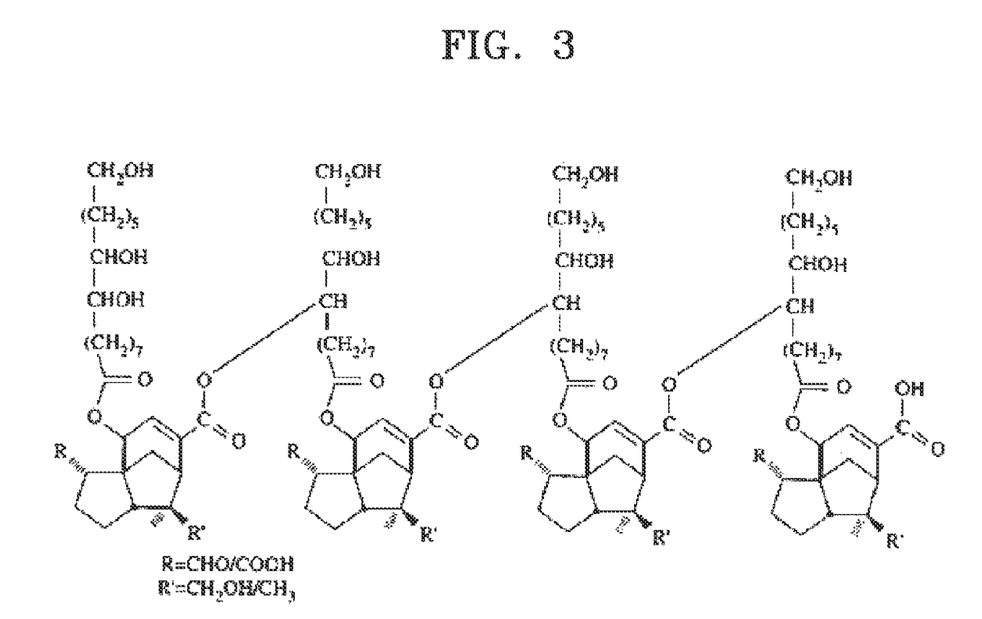
FIG. 3 illustrates a molecular structure of seedlac.

The carbon material 22 may be a material for producing a reduced graphene oxide, and the material may be a seedlac. A seedlac may be prepared from a lac resin, and a molecular structure of the seedlac may be the same as shown in FIG. 3. Preferably, the carbon material 22 arranged in the heating chamber 21 may be solid seedlac or a seedlac in the form of a powder or a thin film.

In the method of preparing a reduced graphene oxide according to an embodiment, a seedlac having a weight in a range equal to or greater than about 1 μg and less than or equal to about 1000 kg may be used. The present embodiment introduces deposition on a substrate having a surface area of about 100 $mm^2$, and an amount of the seedlac used herein may be in a range of about 1 g to about 1.5 g.

When the solid seedlac in the form of a powder is used, a material for preparing a seedlac solution, such as alcohol, is not needed, and thus a manufacturing cost of a reduced graphene oxide may be reduced. Also, since a process for preparing a seedlac solution is unnecessary, the entire preparation process may be simplified.

The carbon material 22 may be arranged on a plate 23 in the heating chamber 21. The plate 23 may include a material that has low reactivity and is not modified at a high temperature so as not to affect the production of a reduced graphene oxide. For example, the plate 23 may be formed of a quartz petri dish.

Next, in step 12, a substrate 24 may be arranged on a top of the carbon material 22, according to an embodiment, where the substrate 24 is arranged adjacent to the arranged carbon material 22. That is, the substrate 24 may be arranged on a top of the plate 23 Step 11 and step 12 may be performed in a reverse order or may be performed simultaneously.

In another embodiment, a carbon material may be arranged on a top of an inside of a heating chamber, and a substrate may be arranged on a bottom of the inside of the heating chamber. Also, in another embodiment, a carbon material may be arranged in the center of an inside of a heating chamber, and a substrate may surround the carbon material and be arranged in the heating chamber. Also, a plurality of carbon materials and substrates may be arranged in a heating chamber.

The method of producing a reduced graphene oxide according to an embodiment may be performed by a single process of annealing the carbon material 22, and thus a material of the substrate 24 may not affect the process. Thus, the substrate 24 may include any of various materials such as a metal, an alloy, a metal oxide, a semiconductor material, and an insulating material, but embodiments are not limited thereto.

Also, the substrate 24 may include a wafer that allows the carbon material 22 to be arranged thereon easily and uniformly. Preferably, the substrate 24 may be an oxidized wafer having an oxide layer ($SiO_2$) formed on a surface thereof. Since a melting temperature of the oxide layer ($SiO_2$) is about 1713° C., the oxide layer may not affect a process of converting seedlac into a reduced graphene oxide.

In the method of producing a reduced graphene oxide according to an embodiment, an oxidized wafer having a diameter in a range of about 2.0 inches or more to about 8.0 inches or less may be used. The present embodiment introduces deposition on a substrate having a surface area of about 100 $mm^2$, and an oxidized wafer having a diameter of about 2.5 inches may be used as the carbon material 22 of about 1 g to about 1.5 g used herein. When the oxidized wafer having a diameter of about 2.5 inches is used, a diameter of the plate 23 may be about 2.5 inches or less so that the carbon material 22 may be entirely deposited on the substrate 24.

When the plate 23 on which the carbon material 22 is arranged and the substrate 24 are ready, an inside of the heating chamber 21 may be heated in step 13. The inside of the heating chamber 21 before heating may be at room temperature, and the inside of the heating chamber 21 may be heated to about 600° C. in step 13. Preferably, the inside of the heating chamber 21 may be heated to about 800° C.

Also, movement of a graphene material produced by the heating may be controlled by making a fluid flow between the carbon material 22 and the substrate 24. The heating chamber 21 may be filled with a gas (nitrogen, argon, or helium), and an internal pressure of the heating chamber 21 may be maintained at atmospheric pressure or lower. Also, the heating chamber 21 may be maintained in a vacuum state, and the internal pressure of the heating chamber 21 may be maintained at about $1\times10^{-1}$ torr or lower. Preferably, the internal pressure of the heating chamber 21 may be maintained at about $1\times10^{-2}$ torr or lower.

When the heating chamber 21 is heated, the carbon material 22 is deposited on the substrate 24 as it is converted into a graphene oxide and diffuses in step 14. The heating chamber 21 may be continuously heated for a sufficient period of time until the carbon material 22 is deposited on the substrate 24, and thus a reduced graphene oxide thin film is produced.

According to the above description, the method of producing a reduced graphene oxide according to an embodiment requires only solid seedlac as a material. In other words, since the method only requires a cost for seedlac (about 2 dollars per 1 kg) as a cost for material purchase, a reduced graphene oxide may be produced at low cost.

Also, according to the above description, the method of producing a reduced graphene oxide according to an embodiment does not use a reducing agent. Therefore, a reduced graphene oxide may be produced without using toxic chemicals such as hydrazine.

Also, according to the above description, the method of producing a reduced graphene oxide according to an embodiment is performed by a single process of annealing, which does not require a complex process.

Also, the reduced graphene oxide produced according to the method described above has better quality than a reduced graphene oxide produced using a method of the related art. In particular, hereinafter, a reduced graphene oxide produced using the method according to an embodiment will be described with reference to FIGS. 4 to 7.

In the following description, a pressure inside a heating chamber was set to $1\times10^{-2}$ torr as a condition for producing a reduced graphene oxide. Also, 1.5 g of a solid powder-type seedlac was used as a carbon material, a quartz petri dish was used as a plate, and a oxidized wafer having a diameter of about 2.5 inches was used as a substrate.

Figure 4:
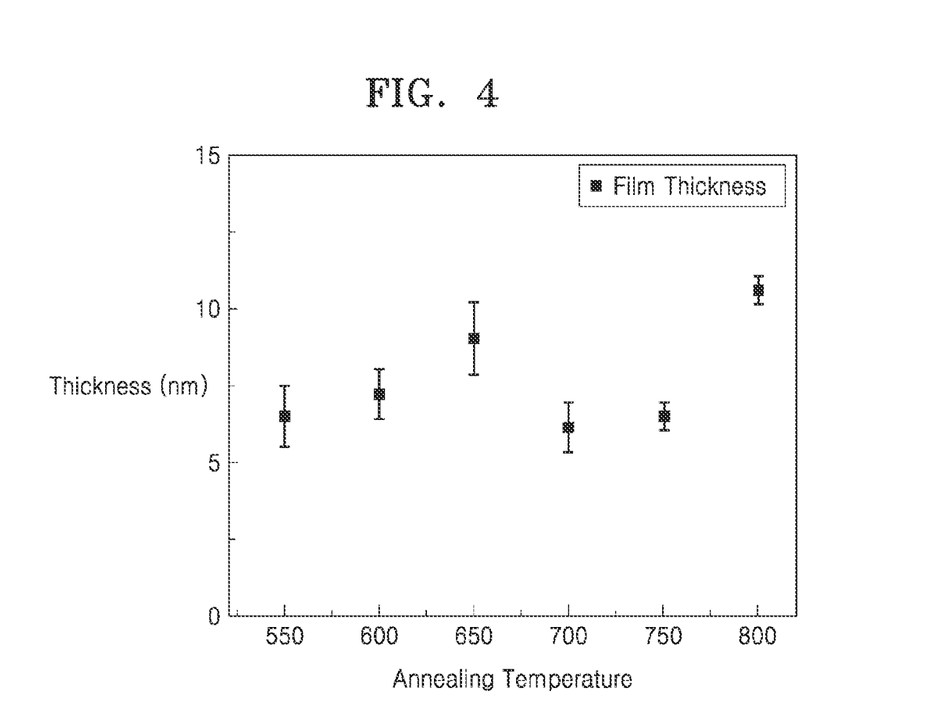
FIG. 4 is a graph that shows a thickness of the reduced graphene oxide produced by the production method according to an embodiment, according to an annealing temperature.

FIG. 4 is a graph that shows a thickness of the reduced graphene oxide produced using the method according to an embodiment according to a heating temperature.

Referring to FIG. 4, when the seedlac was heated to about 550° C., a reduced graphene oxide having a thickness in a range of about 5.5 nm to about 7.5 nm was produced. When the seedlac was heated to about 600° C., a reduced graphene oxide having a thickness in a range of about 6.5 nm to about 8 nm was produced. When the seedlac was heated to about 650° C., a reduced graphene oxide having a thickness in a range of about 8 nm to about 10.5 nm was produced. When the seedlac was heated to about 700° C., a reduced graphene oxide having a thickness in a range of about 5.5 nm to about 7 nm was produced. When the seedlac was heated to about 750° C., a reduced graphene oxide having a thickness in a range of about 6 nm to about 7 nm was produced. When the seedlac was heated to about 800° C., a reduced graphene oxide having a thickness in a range of about 10 nm to about 11 nm was produced.

At all the heating temperature shown in FIG. 4, reduced graphene oxides having a thickness of about 5 nm or more were produced, and, particularly, when the seedlac was heated to about 800° C., the reduced graphene oxide having a thickness of about 10 nm or more was produced, and the reduced graphene oxide was uniformly on a substrate as a variable range of the produced thickness was 1 nm.

Figure 5:
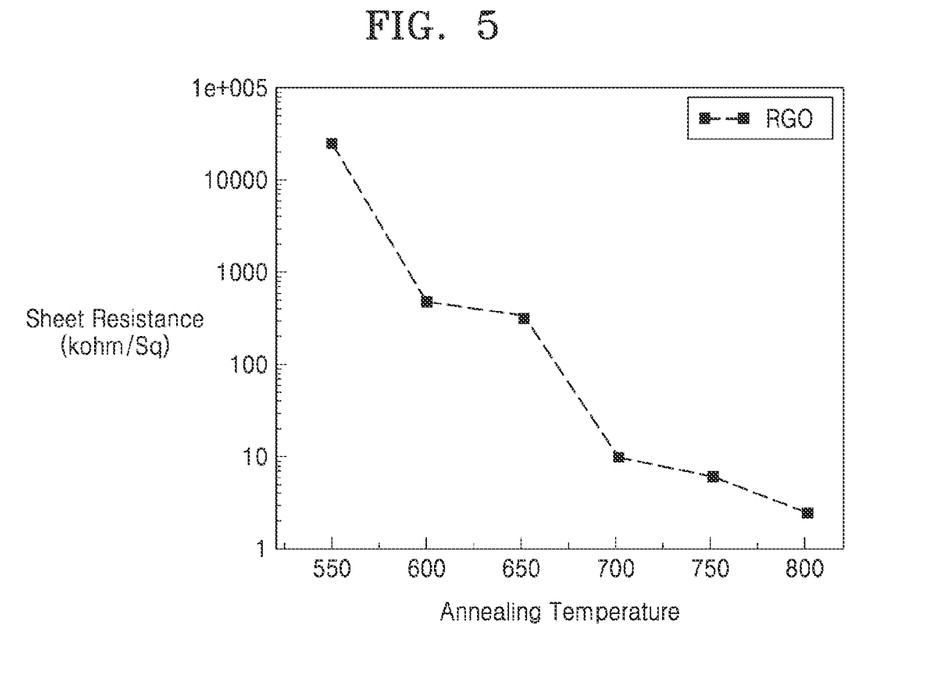
FIG. 5 is a graph that shows a sheet resistance of the reduced graphene oxide produced using the method according to an embodiment, according to an annealing temperature.

FIG. 5 is a graph that shows a sheet resistance of the reduced graphene oxide produced using the method according to an embodiment according to a heating temperature.

Referring to FIG. 5, when the seedlac was heated to about 550° C., a reduced graphene oxide having a sheet resistance of about 20000 kΩ/sq was produced. When the seedlac was heated to about 600° C., a reduced graphene oxide having a sheet resistance of about 500 kΩ/sq was produced. When the seedlac was heated to about 650° C., a reduced graphene oxide having a sheet resistance of about 400 kΩ/sq was produced. When the seedlac was heated to about 700° C., a reduced graphene oxide having a sheet resistance of about 10 kΩ/sq was produced. When the seedlac was heated to about 750° C., a reduced graphene oxide having a sheet resistance of about 6 kΩ/sq was produced. When the seedlac was heated to about 800° C., a reduced graphene oxide having a sheet resistance of about 2 kΩ/sq was produced.

At all the heating temperature shown in FIG. 5, reduced graphene oxides having a sheet resistance of about 20000 kΩ/sq or lower were produced, and, particularly, when the seedlac was heated to about 600° C. or higher, the reduced graphene oxide having a sheet resistance of about 500 kΩ/sq or lower was produced. In particular, at about 800° C. a reduced graphene oxide having a sheet resistance of about 2 kΩ/sq or lower, i.e. an excellent electric conductivity, was produced.

Figure 6:
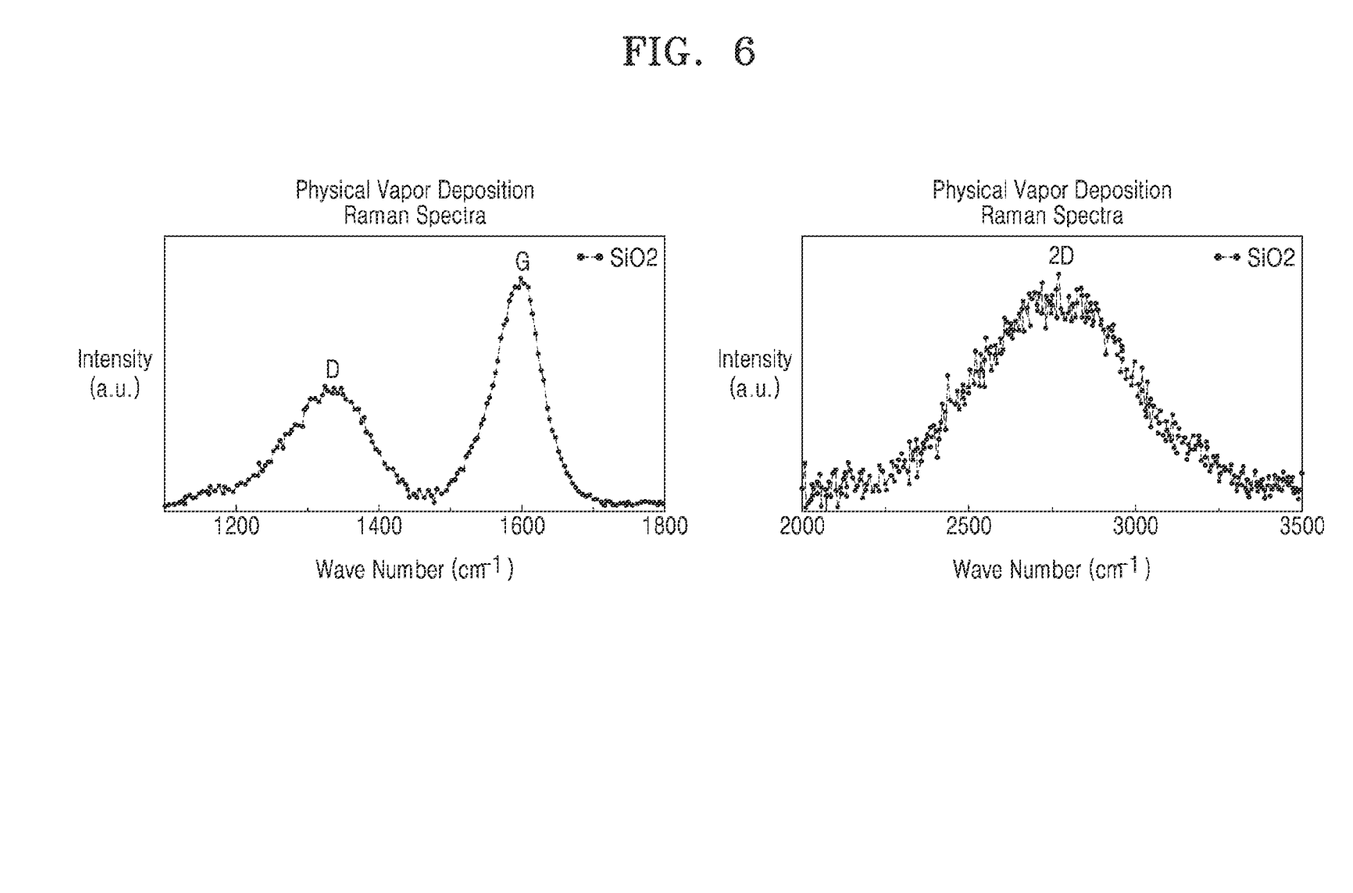
FIG. 6 shows a Raman spectrum of the reduced graphene oxide produced by the production method according to an embodiment.

FIG. 6 shows Raman spectra of the reduced graphene oxide produced using the method according to an embodiment. In particular, FIG. 6 shows Raman spectra of the reduced graphene oxide produced by heating seedlac to a temperature of about 800° C.

Referring to FIG. 6, an $I_D/I_G$ ratio of the produced reduced graphene oxide may be about 0.6, and an $I_{2D}/I_G$ ratio of the reduced graphene oxide may be about 20%. The obtained values will be analyzed in comparison with the references in Table 1.

Figure 7:
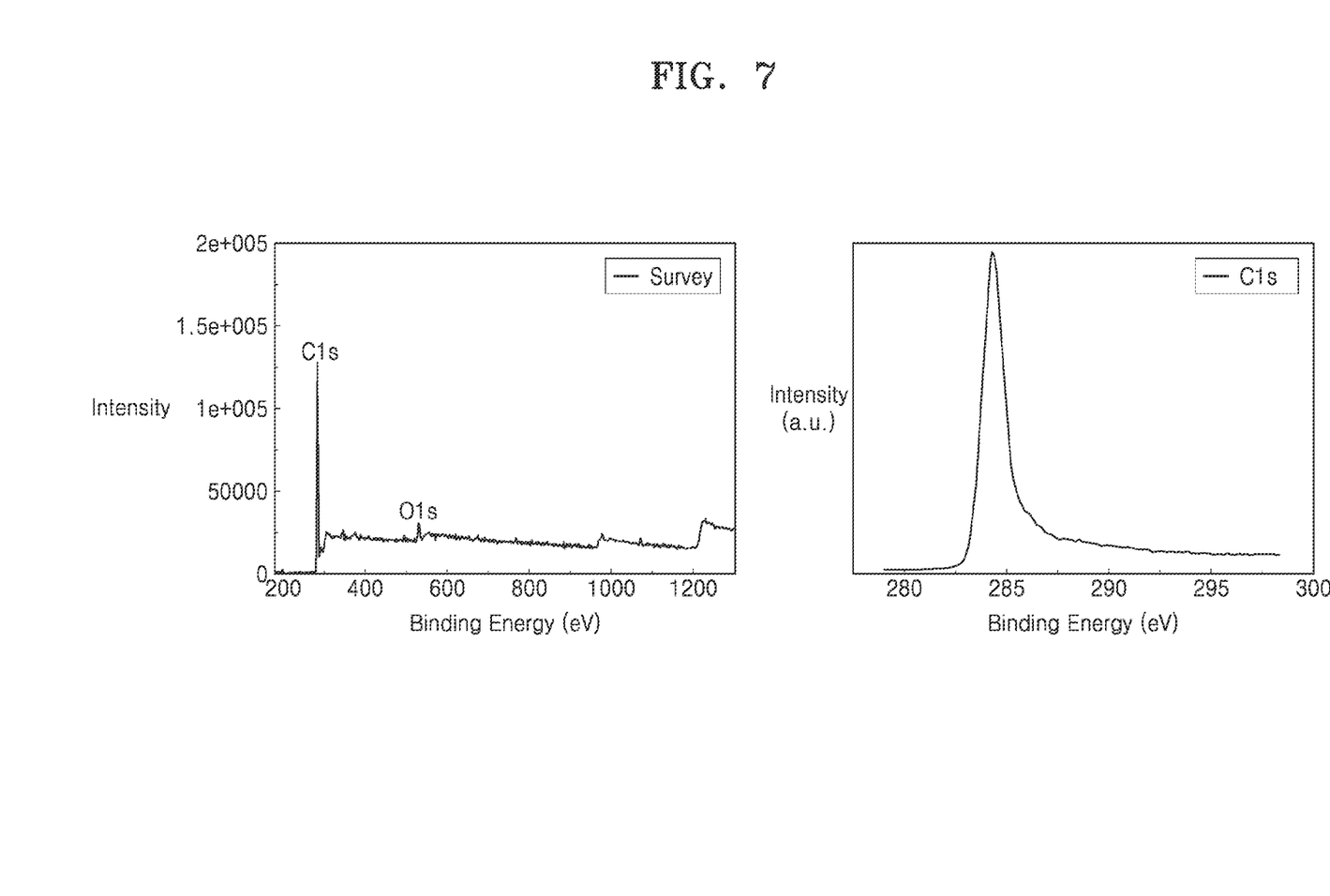
FIG. 7 shows X-ray photoelectron spectroscopy (XPS) spectra of the reduced graphene oxide produced by the production method according to an embodiment.

FIG. 7 shows spectra of an X-ray photoelectron spectroscopy (XPS) of the reduced graphene oxide produced using the method according to an embodiment, in particular, FIG. 7 is spectra of the reduced graphene oxide produced by heating seedlac to about 800° C.

Referring to FIG. 7, the produced reduced graphene oxide may have C1s in a range of about 90% to about 95% and O1s in a range of about 10% to about 5%. The obtained values will be analyzed in comparison with the references in Table 1.

The following Table 1 is a table that compares our values of the reduced graphene oxide described with reference to FIGS. 4 to 7 and earlier reported values according to the references.

TABLE 1

| Properties | Our value | Earlier reported value | References |
|---|---|---|---|
| $I_D/I_G$ | 0.6 | 0.9 | Diaz et al. |
| | | 0.91 | Ren et al. |
| | | 1.15 | Lima et al. |
| | | 0.966-0.76 | Wan et al. |
| | | 0.91 | Guex et al. |
| | | 1.04 | Zhu et al. |
| $I_{2D}/I_G$ | 20% | ~5% | Diaz et al. |
| | | N/A | Zhu et al. |
| C1s(at %) | 90% to 95% | 63% to 74% (RGO) | Ren et al. |
| | | 68% to 89% (RGO) | Lima et al. |
| | | 63% to 85% (RGO) | Wan et al. |
| | | 60% to 90% (RGO) | Diaz et al. |
| | | 68% to 84% (RGO) | Guex et al. |
| | | 68% to 86% (RGO) | Overgaard et al. |
| O1s(at %) | 10% to 5% | 35% to 20% (RGO) | Ren et al. |
| | | 32% to 7% (RGO) | Lima et al. |
| | | 30% to 9% (RGO) | Wan et al. |
| | | 35% to 10% (RGO) | Diaz et al. |
| | | 31% to 12% (RGO) | Guex et al. |
| | | 31% to 12% (RGO) | Overgaard et al. |
| Sheet resistance | ~2KΩ/sq | 1KΩ/sq (RGO) | Ren et al. |
| | | 3.0KΩ/sq (RGO) | Lima et al. |
| | | 1.7KΩ/sq (RGO) | Overgaard et al. |

Referring to Table 1, an $I_D/I_G$ ratio of the reduced graphene oxide produced according to an embodiment is about 0.6, which is a lower value than those of the references as the values of the references are about 0.76 or higher. Therefore, it may be confirmed that the reduced graphene oxide produced according to an embodiment has a $sp^2$ bonded carbon structure having a reduced defect density compared to those of the references. Also, an $I_{2D}/I_G$ ratio of the reduced graphene oxide produced according to an embodiment is about 20%, which is a wider range compared to those of the references as the ratios of the references are less than about 5%. In this regard, it may be confirmed that the reduced graphene oxide produced according to an embodiment has a large $sp^2$ hybridized domain compared to those of the references.

Also, the percentage of C1s of the reduced graphene oxide produced according to an embodiment is greater than about 90%, and the percentage of O1s is less than about 10%, and these are similar to the values of the references.

Also, a sheet resistance of the reduced graphene oxide produced according to an embodiment is about 2 KΩ/sq or lower, which is similar to the values of the references. In other words, it may be confirmed that the reduced graphene oxide produced according to an embodiment has a similar electric conductivity with those of the references.

Sources for data used as the references in Table 1 are as follows.

Diaz et at, "Evolution of the Raman Spectrum with the Chemical Composition of Graphene Oxide," Journal of Physical Chemistry C 121 (37), pp. 20489-20497, 2017.

Ren et al., "Environmentally-friendly conductive cotton fabric as flexible strain sensor based on hot press reduced graphene oxide," Carbon, 111, pp. 622-630, 2017.

Lima et al., "Reduced graphene oxide prepared at low temperature thermal treatment as transparent conductors for organic electronic applications," Organic Electronics 49, pp. 165-173, 2017.

Wan et al., "Graphene paper for exceptional EMI shielding performance using large-sized graphene oxide sheets and doping strategy," Carbon, 122, pp. 74-81, 2017.

Guex et al., "chemical reduction of graphene oxide (GO) to reduced graphene oxide (rGO) by aqueous chemistry," Nanoscale, 9, pp. 9562-9571, 2017.

Zhu et al., "Healing of reduced graphene oxide with methane+hydrogen plasma," Carbon, 120, pp. 274-280, 2017.

Overgaard et al., "Highly Conductive Semitransparent Graphene Circuits Screen-Printed from Water-Based Graphene Oxide Ink," Advanced Materials Technologies, Vol. 2, 1700011, 2017.

While one or more exemplary embodiments have been described, it will be understood by those of ordinary skill in the art that various changes in form and details may be made therein without departing from the spirit and scope as defined by the following claims.

INDUSTRIAL APPLICABILITY

The present disclosure may be applied in the industry producing a reduced graphene oxide, and the reduced graphene oxide produced according to one or more embodiments of the present disclosure may be used in all industries using a reduced graphene oxide.

The invention claimed is:

1. A method of producing a reduced graphene oxide, the method comprising:
   arranging a carbon material;
   arranging a substrate adjacent to the arranged carbon material;
   heating the arranged carbon material to a temperature of about 600° C. or higher; and
   depositing the heated carbon material on the substrate to form a reduced graphene oxide thin film,
   wherein the arranged carbon material is solid seedlac,
   wherein the solid seedlac is in a form of a powder,
   wherein the solid seedlac and the substrate are arranged in a heating chamber of which an internal temperature is controllable,
   wherein the substrate is arranged in a space within about 1 m around the solid seedlac,
   wherein the internal pressure of the heating chamber is about $1\times10^{-1}$ torr or lower, and
   wherein a carbon content of the reduced graphene oxide produced by the method is in a range of about 90% or higher.

2. The method of claim 1, wherein the arranged carbon material is heated to a temperature of about 800° C.

3. The method of claim 1, wherein the substrate comprises any one selected from a metal, an alloy, a metal oxide, and an insulating material.

4. The method of claim 1, wherein the substrate comprises a wafer.

5. The method of claim 4, wherein the substrate comprises an oxidized wafer having an oxide layer ($SiO_2$) on a surface thereof.

6. The method of claim 4, wherein a diameter of the wafer is in a range of about 2.0 inches or more to about 8.0 inches or less.

7. The method of claim 6, wherein a diameter of the wafer is about 2.5 inches.

8. The method of claim 1, wherein:
the heating chamber is filled with a gas, and
an internal pressure of the heating chamber is atmospheric pressure or lower.

9. The method of claim 1, wherein the internal pressure of the heating chamber is about $1 \times 10^{-2}$ torr or lower.

10. The method of claim 1, wherein an internal space of the heating chamber is cylindrical.

11. The method of claim 1, wherein the carbon content of the reduced graphene oxide produced by the method is in a range of about 90% and about 95%.

12. The method of claim 1, wherein a weight of the solid seedlac is in a range of equal to or greater than 1 μg and less than or equal to 1000 kg.

13. The method of claim 12, wherein a weight of the solid seedlac is about 1.5 g.

14. The method of claim 13, wherein the gas flows from the solid seedlac to the substrate.

15. The method of claim 13, wherein the gas includes at least one of nitrogen, argon, and helium.

\* \* \* \* \*